United States Patent
Ohta et al.

(10) Patent No.: US 10,032,892 B2
(45) Date of Patent: Jul. 24, 2018

(54) SEMICONDUCTOR DEVICE (71) Applicant: NATIONAL UNIVERSITY CORPORATION HOKKAIDO UNIVERSITY, Sapporo-shi, Hokkaido (JP)

(72) Inventors: Hiromichi Ohta, Sapporo (JP); Takayoshi Katase, Sapporo (JP); Yuki Suzuki, Sapporo (JP)

(73) Assignee: National University Corporation Hokkaido University, Sapporo-shi, Hokkaido (JP)

( * ) Notice: Subject to any disclaimer, the term of this patent is extended or adjusted under 35 U.S.C. 154(b) by 0 days.

(21) Appl. No.: 15/541,936

(22) PCT Filed: Jan. 6, 2016

(86) PCT No.: PCT/JP2016/050206
§ 371 (c)(1),
(2) Date: Jul. 6, 2017

(87) PCT Pub. No.: WO2016/111306
PCT Pub. Date: Jul. 14, 2016

(65) Prior Publication Data
US 2017/0373173 A1    Dec. 28, 2017

(30) Foreign Application Priority Data
Jan. 9, 2015    (JP) .................... 2015-002769

(51) Int. Cl.
*H01L 29/49*    (2006.01)
*H01L 29/66*    (2006.01)
(Continued)

(52) U.S. Cl.
CPC ........ *H01L 29/66984* (2013.01); *H01L 29/24* (2013.01); *H01L 29/51* (2013.01); *H01F 10/1933* (2013.01)

(58) Field of Classification Search
CPC .... H01L 29/66984; H01L 29/24; H01L 29/51
See application file for complete search history.

(56) References Cited

U.S. PATENT DOCUMENTS

2016/0351696 A1*   12/2016   Habib ............... H01L 29/66136

FOREIGN PATENT DOCUMENTS

| JP | 2009-260167 A | 11/2009 |
|----|---------------|---------|
| JP | 2010-114231 A | 5/2010  |

(Continued)

OTHER PUBLICATIONS

International Search Report of PCT/JP2016/050206, dated. Mar. 15, 2016, 1 page.

(Continued)

*Primary Examiner* — Michael Shingleton
(74) *Attorney, Agent, or Firm* — Sterne, Kessler, Goldstein & Fox P.L.L.C.

(57)    ABSTRACT

This semiconductor device comprises an active layer that is formed of an oxide magnetic material and a porous dielectric body that contains water and is provided on the active layer. By using hydrogen ions and hydroxide ions which are formed by electrolysis of water, the crystal structure of the active layer is changed between a ferromagnetic metal and an antiferromagnetic insulating body.

12 Claims, 7 Drawing Sheets

(51) Int. Cl.
    *H01L 29/24*     (2006.01)
    *H01L 29/51*     (2006.01)
    *H01F 10/193*    (2006.01)

(56) References Cited

FOREIGN PATENT DOCUMENTS

| | | |
|---|---|---|
| JP | 2010-232562 A | 10/2010 |
| JP | 2012-033910 A | 2/2012 |
| JP | 2013-058666 A | 3/2013 |
| JP | 2013-183040 A | 9/2013 |
| WO | WO 2004/102696 | * 11/2004 |

OTHER PUBLICATIONS

Chiba et al., "Electrical control of the ferromagnetic phase transition in cobalt at room temperature," Nature Materials, vol. 10, Nov. 2011, pp. 853-856.
Yamada et al., "Electrically Induced Ferromagnetism at Room Temperature in Cobalt-Doped Titanium Dioxide," Science, vol. 332, May 2011, pp. 1065-1068.
Jeen et al., "Reversible redox reactions in an epitaxially stabilized SrCoOx oxygen sponge," Nature Materials, vol. 12, Nov. 2013, pp. 1057-1063.

\* cited by examiner

SEMICONDUCTOR DEVICE

TECHNICAL FIELD

The present invention relates to a semiconductor device in which an oxide magnetic material is used for an active layer, and, in particular, relates to a semiconductor device in which a crystal structure of the active layer is changed to switch characteristics of the active layer between a ferromagnetic metal and an antiferromagnetic insulator.

BACKGROUND ART

In recent years, the next-generation spintronics is attracting much attention in which electron spin, which is a small magnet in a magnetic material, is controlled by an electric field instead of a magnetic field; and an example of the next-generation spintronics is a ferromagnetic thin film transistor in which a magnetic material is used for an active layer so that magnetism of the active layer is controlled by a gate voltage. In this arrangement, because most of magnetic materials have a carrier density (about $10^{22}$ cm$^3$) of electrons (or holes) as high as metal, if a dielectric material used in semiconductor electronics is used for a gate insulating film, a carrier density cannot be modulated sufficiently. To address this issue, there is proposed an electric-double-layer gated transistor in which an ionic liquid is used to modulate the carrier density in a ferromagnetic material (for example, see Non-Patent Documents 1 and 2).

PRIOR ART DOCUMENTS

Non-Patent Documents

Non-Patent Document 1: D. Chiba et al., Nature Materials 10, 853 (2011),
Non-Patent Document 2: Y. Yamada et al., Science 332, 1065 (2011),

SUMMARY OF THE INVENTION

Problems to be Solved by the Invention

However, an electric-double-layer gated transistor using an ionic liquid has the following problems. The spin state of the magnetic material can be modulated by an electric field at a room temperature, but an ionic liquid is in a liquid state at a room temperature. Therefore, a liquid leakage countermeasure is necessary such as sealing of the entire device, which makes the device structure complex. In addition, an organic ionic liquid generally used as an ionic liquid has a risk of firing when heated equal to or higher than a room temperature, which has a safety problem as well.

To address these problems, an object of the present invention is to provide a semiconductor device instead of an electric-double-layer gated transistor using an ionic liquid. In the semiconductor device, a crystal structure of an active layer is changed by using electrolysis of water held in a porous insulator so that the characteristics of the active layer between a ferromagnetic metal and an antiferromagnetic insulator is switched.

Means for Solving the Problems

The present invention is a semiconductor device which includes: an active layer made of an oxide magnetic material; and porous dielectrics which contains water and is provided on the active layer, wherein hydrogen ions and hydroxide ions generated by electrolysis of the water are used to change a crystal structure of the active layer between a ferromagnetic metal and an antiferromagnetic insulator.

Further, the present invention is also a semiconductor device which includes:

a substrate; an active layer which is provided on the substrate and is made of an oxide magnetic material; a source electrode and a drain electrode disposed on the substrate so as to sandwich the active layer; porous dielectrics which contains water and is provided on the active layer; and a gate electrode provided on the porous dielectrics. A voltage is applied to the gate electrode to electrolyze the water, and hydrogen ions and hydroxide ions generated by the electrolyzing is used to change a crystal structure of the active layer between a ferromagnetic metal and an antiferromagnetic insulator.

Effects of the Invention

The present invention can provide a semiconductor device which can operate at a room temperature in which hydrogen ions and hydroxide ions generated by electrolysis of water are used to change the crystal structure (oxygen content) of the active layer so as to switch the characteristics of the active layer between a ferromagnetic metal and an antiferromagnetic insulator.

EMBODIMENTS OF THE INVENTION

Figure 1:
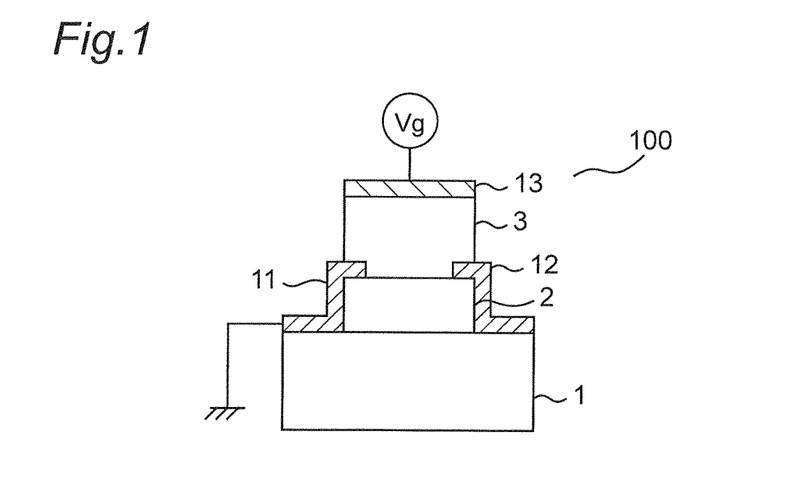
FIG. 1 is a schematic diagram of a cross-section of a magnetic transistor according to the embodiment of the present invention.

FIG. 1 is a schematic diagram of a cross-section of a magnetic transistor (occasionally referred to as a "magnetic thin-film transistor") according to the embodiment of the present invention, which is wholly represented by reference symbol 100. The magnetic transistor 100 includes a substrate 1. For the substrate 1, a single crystal substrate of (001) SrTiO$_3$ is used, for example; however, other oxides represented by $ABO_3$ (A: Ca, Sr, Ba; B: Co, Mn, Cr, Fe, Ni), LSAT ($La_{0.3}Sr_{0.7}Al_{0.65}Ta_{0.35}O_3$), in addition, silicon or glass may be used. Further, the orientation of the substrate 1 is not limited to (001).

On the substrate 1 is provided an active layer 2. For the active layer 2, $SrCoO_{2.5}$ is used, for example, which is an antiferromagnetic insulator with a brownmillerite structure. The active layer 2 has a film thickness of 30 nm, for example.

As the material for the active layer 2, other oxides represented by $ABO_x$ (A: Ca, Sr, Ba; B: Co, Mn, Cr, Fe, Ni; $2.0 \leq x \leq 3.5$) may be used if the characteristics of the material can be changed between a ferromagnetic metal and an antiferromagnetic insulator due to the change in the crystal structure.

On the active layer 2 is provided a gate insulating film 3, which is a porous insulator. Although, for example, $12CaO \cdot 7Al_2O_3$ (C12A7) is used for the gate insulating film 3, there may be alternatively used $CaO$, $Al_2O_3$, $12SrO \cdot 7Al_2O_3$, $Y_2O_3$, $HfO_2$, $SiO_2$, $MgO$, $NaTaO_3$, $KTaO_3$, $LaAlO_3$, $ZrO_2$, $MgAl_2O_4$, $Nb_2O_5$, $Ta_2O_5$, $Si_3N_4$, $SrTiO_3$, $BaTiO_3$, $CaTiO_3$, $SrZrO_3$, $CaZrO_3$, $BaZrO_3$, zeolite, or a material containing two or more of these materials. These materials may be in an amorphous state or a crystal state. Alternatively, a resin material such as plastic may be used if the resin material is porous.

The gate insulating film 3 made of a porous insulator has a plurality of holes formed in the surface or inside thereof, and has a microstructure, which is so-called nanopore or mesopore. The diameters of the holes are 0.3 to 100 nm and preferably are 5 to 20 nm. Further, the hole factor, which is the ratio of the volume of the holes to the volume of the gate insulating film 3, is 5 to 70 vol %, and preferably is 20 to 50 vol %. The holes are spherical, for example, without being limited to that shape.

The holes in the gate insulating film 3 contain therein water. The moisture content, which is the ratio of the volume of the water contained in the holes to the volume of the holes, is 23 to 100 vol %, preferably is 50 to 100 vol %, and more preferably is 80 to 100 vol %. Note that the moisture content is an average value of the whole gate insulating film 3, and not all the holes have to satisfy the above moisture content.

The gate insulating film 3 has a film thickness of 200 nm, for example.

On the substrate 1, there are provided a source electrode 11 and a drain electrode 12 on both sides of the active layer 2, facing each other with the active layer 2 therebetween. Parts of the source electrode 11 and the drain electrode 12 may be sandwiched by the active layer 2 and the gate insulating film 3 therebetween. Further, on the gate insulating film 3 is provided a gate electrode 13. The source electrode 11, the drain electrode 12, and the gate electrode 13 are made of, for example, titanium, gold, nickel, aluminum, or molybdenum.

As shown in FIG. 1, for example, the source electrode 11 of the magnetic transistor 100 is grounded (GND), and a gate voltage Vg is applied to the gate electrode 13.

Figure 2:
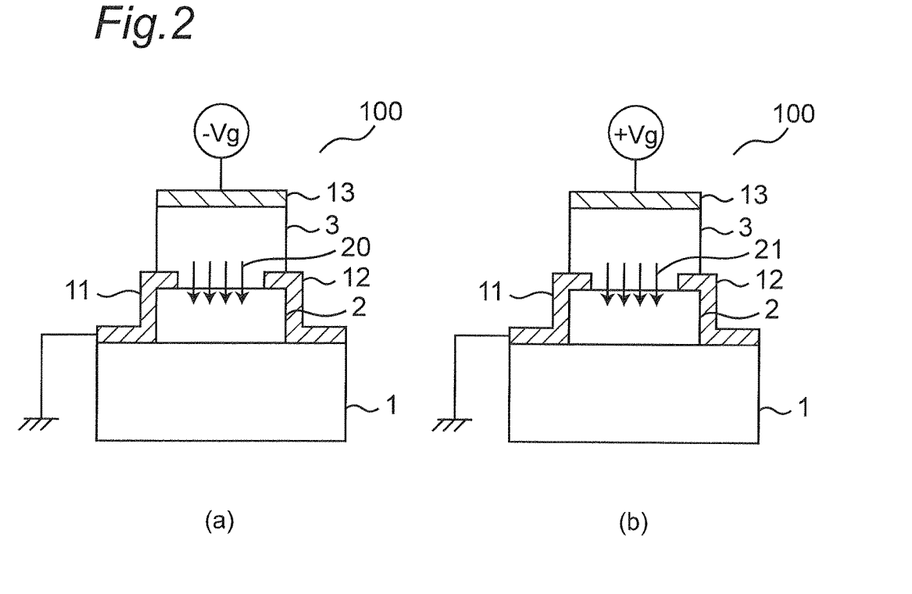
FIG. 2 is a schematic diagram of an operation of the magnetic transistor according to the embodiment of the present invention.

Next, operation of the magnetic transistor 100 according to the embodiment of the present invention will be described with reference to FIGS. 1 and 2. In FIG. 2, the same reference symbol as in FIG. 1 represents the same or equivalent part. Further, the operation can be performed at a room temperature.

FIG. 1 shows the magnetic transistor 100 when no voltage is applied to the gate electrode 13, and the active layer 2 is made of $SrCoO_{2.5}$ which is an antiferromagnetic insulator with a brownmillerite structure. Therefore, the active layer 2 has an insulation property, and no current flows between the source electrode 11 and the drain electrode 12; thus, the magnetic transistor 100 is in off-state.

Next, as shown in FIG. 2(*a*), when the gate electrode 13 is fed with, for example, a negative voltage of −50 V, an electric field is created in the thickness direction of the gate insulating film 3 made of a porous insulator. With this electric field, the moisture contained in the holes in the gate insulating film 3 is electrolyzed into protons ($H^+$) having positive electric charges and hydroxide ions ($OH^-$) having negative electric charges, and the protons move to the gate electrode 13 side charged negative, and in an opposite manner, the hydroxide ions move to the active layer 2 side (arrows 20).

The hydroxide ions having moved to the active layer 2 side react and become water and oxygen, and the oxygen moves into the active layer 2 as shown by arrows 20 in FIG. 2(*a*). When the oxygen is injected into the active layer 2 made of $SrCoO_{2.5}$ with a brownmillerite structure, an oxidation reaction occurs, and the $SrCoO_{2.5}$ with a brownmillerite structure is oxidized, whereby the oxygen content (oxygen nonstoichiometry) is changed; thus, the crystal structure is changed into $SrCoO_3$ with a perovskite structure. As a result, the active layer 2 becomes a ferromagnetic metal and conductive, and the magnetic transistor 100 thus becomes on-state.

In the magnetic transistor 100 having become on-state, even when the voltage applied to the gate electrode 13 is made 0 V, the active layer 2 is maintained to be $SrCoO_3$, which is a ferromagnetic metal, and the on-state is maintained.

Next, when a positive voltage of, for example, +80 V is applied to the gate electrode 13 as shown in FIG. 2(*b*), the direction of the electric field is reversed; thus, the hydroxide ions generated by the electrolysis of water move to the gate electrode 13 side charged positive, and the protons moves to the active layer 2 side.

The protons (arrow 21) having moved to the active layer 2 side reduce (draw oxygen) the $SrCoO_3$ with a perovskite structure, the oxygen content (oxygen nonstoichiometry) of the $SrCoO_3$ with a perovskite structure is reduced, and the crystal structure is thus changed into $SrCoO_{2.5}$ with a brownmillerite structure. As a result, the active layer 2 becomes an antiferromagnetic insulator having an insulation property, and the magnetic transistor 100 thus becomes off-state.

As described above, in the magnetic transistor 100 according to the embodiment of the present invention, the moisture contained in the gate insulating film 3 made of a porous material is electrolyzed, and the obtained hydrogen and oxygen are used to change an oxygen nonstoichiometric value of the magnetic material oxide constituting the active layer 2 so as to change the crystal structure between a ferromagnetic metal and an antiferromagnetic insulator, whereby the active layer 2 is switched between insulating property and conductive property, and as a result, the magnetic transistor 100 can be turned on and off at a room temperature.

Note that in order to manufacture the magnetic transistor 100, it is possible to use, as the active layer 2, $SrCoO_3$, which is a ferromagnetic metal with a perovskite structure, instead of an antiferromagnetic insulator with a brownmillerite structure. In this case, by applying a positive voltage to the gate electrode 13, $SrCoO_3$ is reduced and becomes $SrCoO_{2.5}$, and the active layer 2 is thus changed from a perovskite structure to a brownmillerite structure. As a result, the active layer 2 is switched from a conductive ferromagnetic metal to an insulating antiferromagnetic insulator. To the contrary, by applying a negative voltage to the gate electrode 13, the active layer 2 is switched from an insulating antiferromagnetic insulator to a conductive ferromagnetic metal.

Figure 3:
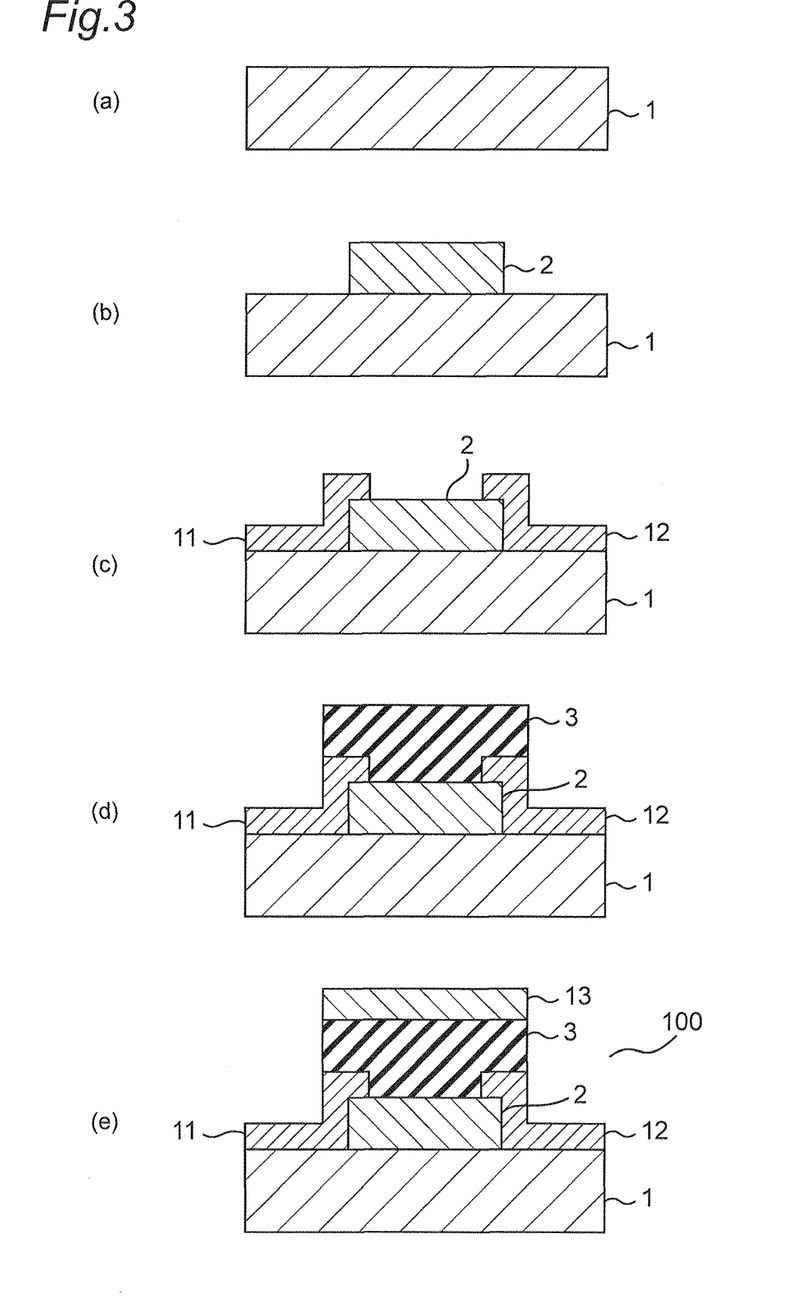
FIG. 3 is a sectional view of a production process of the magnetic transistor according to the embodiment of the present invention.

Next, with reference to FIG. 3, a description will be given to a manufacturing method of a magnetic transistor 100 according to the embodiment of the present invention. In FIG. 3, the same reference symbol as in FIGS. 1 and 2 represents the same or equivalent part. The manufacturing method includes the following steps 1 to 5.

Step 1: As shown in FIG. 3 (a), a single crystal substrate made of, for example, (001) $SrTiO_3$ is prepared. The substrate may be made of other oxides represented by $ABO_3$ (A: Ca, Sr, Ba; B: Co, Mn, Cr, Fe, Ni), LSAT, silicon, or glass.

Step 2: As shown in FIG. 3(b), the active layer 2 made of $SrCoO_{2.5}$ is formed at a predetermined position on the substrate 1 by using a metal mask. The active layer 2 is formed by using, for example, a pulsed laser deposition method or an electron beam vapor deposition method. In this process, the substrate temperature is 700 to 800° C., for example, and the oxygen pressure in the chamber is 10 Pa, for example. The active layer 2 has a film thickness of 30 nm, for example.

Step 3: As shown in FIG. 3(c), the source electrode 11 and the drain electrode 12 are formed at predetermined positions on the substrate 1 by using a metal mask. The source electrode 11 and the drain electrode 12 are made of a common electrode material such as titanium and gold, and formed by using, for example, an electron beam vapor deposition method. The source electrode 11 and the drain electrode 12 have a film thickness of 20 nm, for example.

Step 4: As shown in FIG. 3(d), the gate insulating film 3 is formed on the active layer 2 by using a metal mask. The gate insulating film 3 is made of $12CaO.7Al_2O_3$, for example. The gate insulating film 3 is formed, for example, in a depressurized chamber by using a pulsed laser deposition method. In the pulsed laser deposition method, after the pressure in the chamber is reduced to $10^{-5}$ to $10^{-8}$ Pa, oxygen is introduced into the chamber, and the oxygen pressure is kept at 1 to 10 Pa. Subsequently, KrF excimer laser or the like is irradiated to a material target to deposit the gate insulating film 3 at a predetermined position on the active layer 2. The irradiation conditions of the KrF excimer laser are, for example: the wavelength is 248 nm, the pulse width is 20 ns, and the repetition frequency is 10 Hz. By controlling the oxygen pressure in the chamber as described above, it is possible to obtain the gate insulating film 3 made of a porous insulator having a hole rate of 20 vol % or higher.

After the gate insulating film 3 made of a porous insulator is formed, air is introduced into the chamber to set the chamber to a normal pressure, whereby the moisture contained in the air is taken into the holes. The moisture content of the holes becomes 23 to 100 vol %, for example.

Step 5: As shown in FIG. 3(e), the gate electrode 13 is formed on the gate insulating film 3. The gate electrode 13 is made of a common electrode material such as titanium and gold, and is formed by using an electron beam vapor deposition method, for example.

Through the above steps, the magnetic transistor 100 according to the embodiment of the present invention is completed.

Next, the characteristics of the magnetic transistor 100 shown in the following experimental example were compared with the characteristics of a comparative example which does not have a gate insulating film made of a porous material.

Experimental Example

The magnetic transistor 100 was made as follows. First, a (001) $SrTiO_3$ single crystal substrate (made by SHINKO-SHA CO., LTD., size 10×10×0.5 mm) was prepared, and the active layer 2 made of $SrCoO_{2.5}$ and having a film thickness of 30 nm was deposited on the substrate through a metal mask (made by P-One Co., Ltd.) by a pulsed laser deposition method. The substrate temperature was 720° C., and the oxygen pressure was 10 Pa.

Next, the source electrode 11 and the drain electrode 12 were formed by an electron beam vapor deposition method. The source electrode 11 and the drain electrode 12 were made of titanium, and had a film thickness of 20 nm.

Next, by a pulsed laser deposition method, a gate insulator 3 made of a porous $12CaO.7Al_2O_3$ thin film having a film thickness of 200 nm was formed on the active layer 2. The substrate was not heated, and the oxygen pressure in the chamber was 5 Pa. The channel length (the distance between the source electrode 11 and the drain electrode 12) L and the channel width (the distance between the source electrode 11 and the drain electrode 12) W of the manufactured transistor were both 4.0 mm.

Finally, the gate electrode 13 made of titanium was formed on the gate insulator 3. By the above process, the magnetic transistor 100 according to the experimental example was manufactured.

Sheet Resistance

With respect to the magnetic transistor 100, the sheet resistance of the active layer 2 was measured at a room temperature in the state shown in FIG. 1 and FIGS. 2 (a) and (b). The sheet resistance was measured by using the source electrode 11 and the drain electrode 12. A result of the measurement shows that the sheet resistance is: 340 kΩ/sq when no voltage is applied to the gate electrode 13 (FIG. 1); 1 kΩ/sq when the voltage is −50 V (FIG. 2(a)); and 100 kΩ/sq when the voltage is +80 V (FIG. 2(b)). The result of the measurement also shows that the sheet resistance is changed depending on the gate voltage and that the magnetic transistor 100 can be turned on and off accordingly. In the measurement, the voltage applied to the gate electrode 13 was −50 V and +80 V; however, as described later, it was confirmed that also when the voltages are −3 V and +3 V, the sheet resistance can be changed and that the magnetic transistor 100 can be turned on and off.

X-Ray Diffraction

Figure 4:
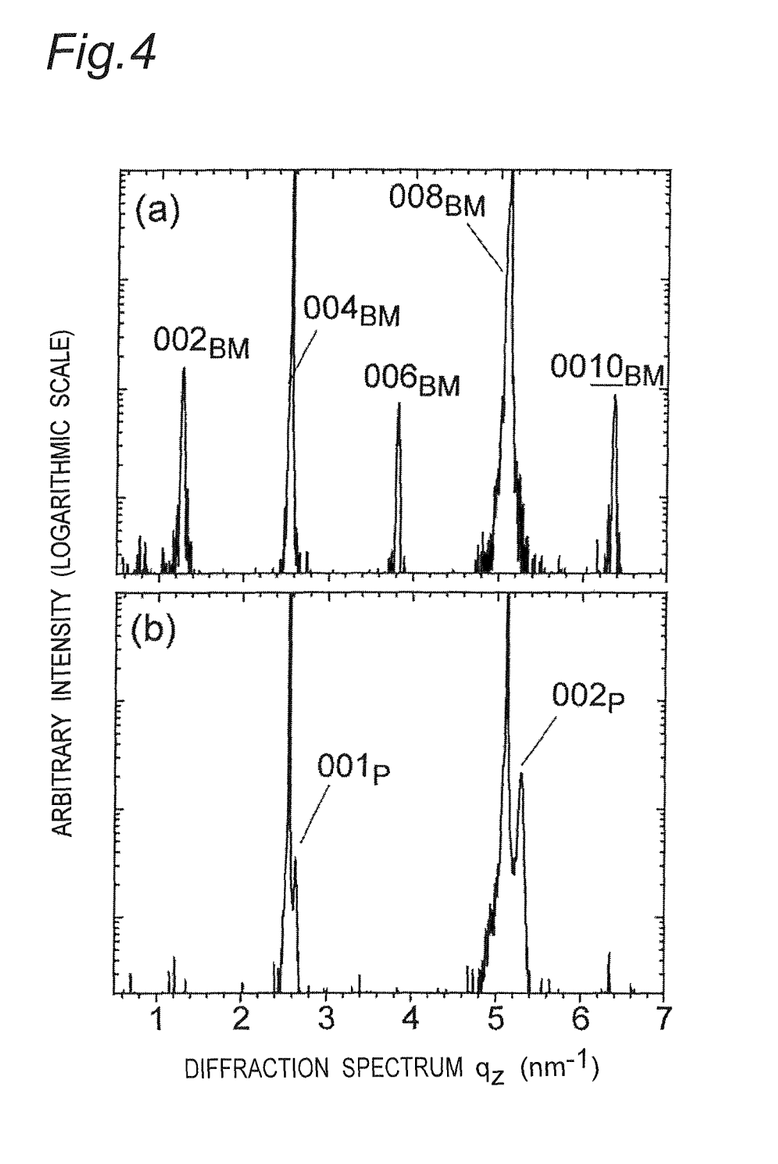
FIG. 4 is an X-ray diffraction pattern of the magnetic transistor according to the embodiment of the present invention.

FIG. 4 is an X-ray diffraction pattern of the active layer 2 of the magnetic transistor 100. Graph (a) shows the X-ray diffraction pattern before the gate voltage is applied and after the positive gate voltage (+80 V) is applied (the states of FIG. 1 and FIG. 2(b)), and graph (b) shows the X-ray diffraction pattern after the negative gate voltage (−50 V) is applied (the state of FIG. 2(a)). The horizontal axis represents the scattering vector, and the vertical axis represents the intensity (arbitrary scale). Further, symbol BM represents brownmillerite $SrCoO_{2.5}$, symbol P represents perovskite $SrCoO_3$, and the figures represent the diffraction indices.

As shown in FIG. 4, graph (a) shows that before the gate voltage is applied and after the positive gate voltage (+80 V) is applied, the peaks due to a brownmillerite structure represented by symbol BM are shown, and it is therefore understood that the active layer 2 is made of $SrCoO_{2.5}$ with a brownmillerite structure. Further, it is also understood that a thin film of $SrCoO_{2.5}$ is an epitaxial thin film which is strongly aligned in the c-axis and that the thin film of $12CaO.7Al_2O_3$ constituting the gate insulator 3 is amorphous.

On the other hand, as shown in graph (b), after the negative gate voltage (−50 V) is applied, the peaks represented by symbol P due to a perovskite structure are observed instead of the peaks represented by symbol BM, and it is therefore understood that the active layer 2 has become $SrCoO_3$ with a perovskite structure.

As described above, it is understood that the structure of the active layer 2 is changed between brownmillerite $SrCoO_{2.5}$ and perovskite $SrCoO_3$ by changing the gate voltage.

Magnetization Characteristics

Figure 5:
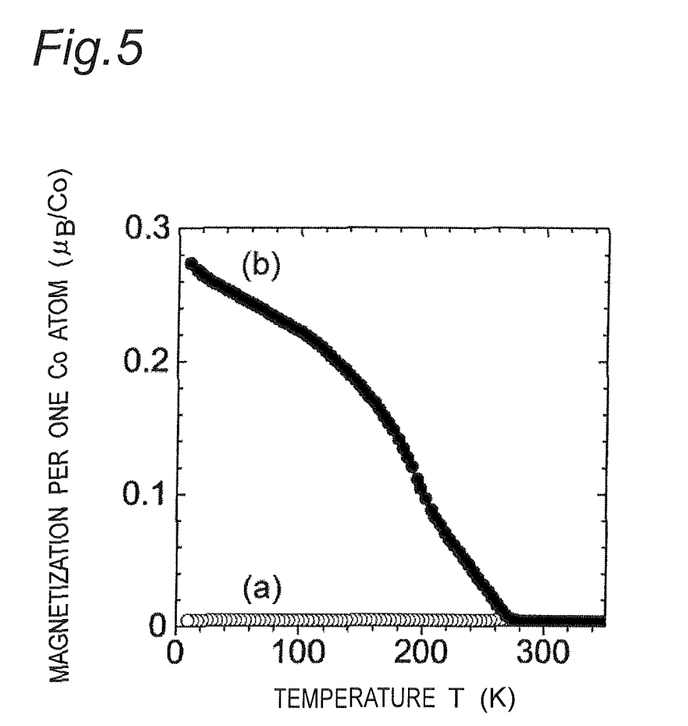
FIG. 5 is a temperature dependency of a magnetic characteristic of the magnetic transistor according to the embodiment of the present invention.

FIG. 5 shows the temperature dependency of the magnetization characteristics of the magnetic transistor 100. With reference to FIG. 5, the horizontal axis represents the temperature, and the vertical axis represents the magnetization per one Co atom. In FIG. 5, symbol (a) represents the magnetization before the gate voltage is applied (the state of FIG. 1), and symbol (b) shows the magnetization after the gate voltage of −50 V is applied (the state of FIG. 2(a)). The magnetic characteristics were measured by using the magnetic characteristics measurement device MPMS (made by Quantum Design, Inc.) in the temperature range of 10 to 350K with a magnetic field of 20 Oe being applied.

As is understood from FIG. 5, there is no signal of magnetization observed before the gate voltage is applied (see symbol (a)); however, after the gate voltage of −50 V is applied, large magnetization is observed as symbol (b), and it is understood that a ferromagnetic material is achieved. The measurement result shows that the application of the negative gate voltage changes the active layer 2 from $SrCoO_{2.5}$, which is an antiferromagnetic insulator to $SrCoO_3$, which is a ferromagnetic metal.

Thermopower

In order to check if the active layer 2 became metal when gate voltage of −50 V was applied to the gate electrode 13 (the case of FIG. 2(a)), the thermopower was measured at a room temperature. The thermopower was measured by applying a temperature difference of 5 to 10K between the source electrode 11 and the drain electrode 12 and by measuring the thermoelectric power generated between the electrodes in this state. Thus, the thermopower was calculated based on the relationship between the applied temperature difference and the thermoelectric power.

A result of the measurement shows that the thermopower before the application of the gate voltage (the case of FIG. 1) was +300 μV/K, and the thermopower after the application of the gate voltage of −50 V (the case of FIG. 2(a)) was +10 μV/K. These values of the thermopowers are almost the same as the values of the thermopowers of, for example, $SrCoO_{2.5}$ and $SrCoO_3$ described in the document (H. Jeen et al., Nature Materials 12, 1057 (2013)). These facts show that the application of the negative gate voltage causes insulator $SrCoO_{2.5}$ to change to metal $SrCoO_3$.

As described above, in the magnetic transistor 100 of the experimental example, the crystal structure of the active layer is changed between the brownmillerite $SrCoO_{2.5}$ structure and the perovskite structure by controlling gate voltage, and the active layer is thus switched between a ferromagnetic metal and an antiferromagnetic insulator, and the transistor operation is possible at a room temperature.

Figure 6:
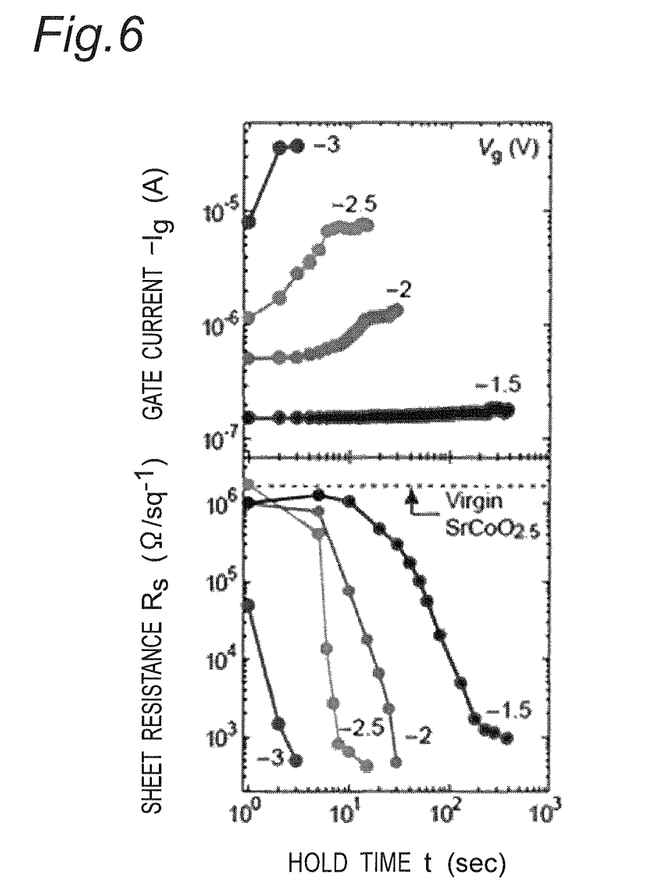
FIG. 6 is a graph showing changes in a gate current and a sheet resistance of the magnetic transistor according to the embodiment of the present invention with respect to an application time of a positive gate voltage.
Figure 7:
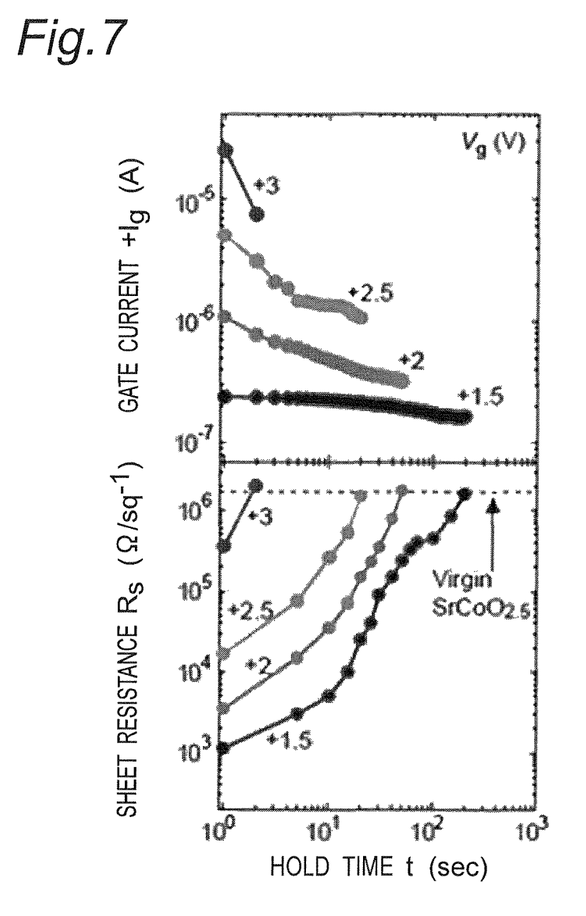
FIG. 7 is a graph showing changes in the gate current and the sheet resistance of the magnetic transistor according to the embodiment of the present invention with respect to an application time of a negative gate voltage.

Changes in the Gate Current and the Sheet Resistance with Respect to the Application Time of the Gate Voltage FIGS. 6 and 7 are graphs each showing the changes in the gate current and the sheet resistance of the magnetic transistor 100 with respect to the application time of the gate voltage. FIG. 6 shows the changes when the active layer 2 is oxidized ($SrCoO_{2.5}$ to $SrCoO_3$), and FIG. 7 shows the changes when the active layer 2 is reduced ($SrCoO_3$ to $SrCoO_{2.5}$).

With reference to FIG. 6, while each of the four different gate voltages Vg (−3 V, −2.5 V, −2 V, and −1.5 V) was applied to the gate electrode of the magnetic transistor 100 in off-state and held, the gate current Ig was measured; and the sheet resistance of the active layer 2 was then measured after the gate voltage was turned off to see how the sheet resistance changed with respect to the application time of the gate voltage. The gate current was measured by using the gate electrode 13 and the source electrode 11. For example, in the case that the gate voltage Vg is −3 V, the sheet resistance changes from $2 \times 10^6$ Ω/sq due to $SrCoO_{2.5}$ to $4 \times 10^2$ Ω/sq with respect to the hold time of about 2 to 3 seconds, and the magnetic transistor 100 is switched from off-state to on-state. That is, $SrCoO_{2.5}$ of the active layer 2 is oxidized and changes to $SrCoO_3$. The switching time from off-state to on state is longer for a smaller application voltage, for example, 15 seconds for the gate voltage Vg of −2.5 V, and 30 seconds for −2.0 V. Further, along with the decrease in the sheet resistance of the active layer 2, the gate current Ig also increases.

On the other hand, with reference to FIG. 7, while each of the four different gate voltages Vg (+3 V, +2.5 V, +2 V, and +1.5 V) was applied to the gate electrode of the magnetic transistor 100 in on-state and held, the gate current Ig was measured; and the sheet resistance of the active layer 2 was then measured after the gate voltage was turned off to see how the sheet resistance changed with respect to the application time of the gate voltage. For example, in the case that the gate voltage Vg is +3 V, the sheet resistance changes from $4 \times 10^2$ Ω/sq to $2 \times 10^6$ Ω/sq with respect to the hold time of about 2 to 3 seconds, and the magnetic transistor 100 is switched from on-state to off-state. That is, $SrCoO_3$ of the active layer 2 is reduced and becomes $SrCoO_{2.5}$. The switching time from on-state to off-state is longer for a smaller gate voltage Vg. Further, along with the increase of the sheet resistance of the active layer 2, the gate current Ig also decreases.

As described above, it is understood that, in the magnetic transistor according to the embodiment of the present invention, the magnetic transistor 100 can be reversibly turned on and off with a hold time of approximately 2 to 3 seconds also by setting the gate voltage Vg to relatively low voltages of −3 V and +3 V.

The Electron Density and the Sheet Resistance

Figure 8:
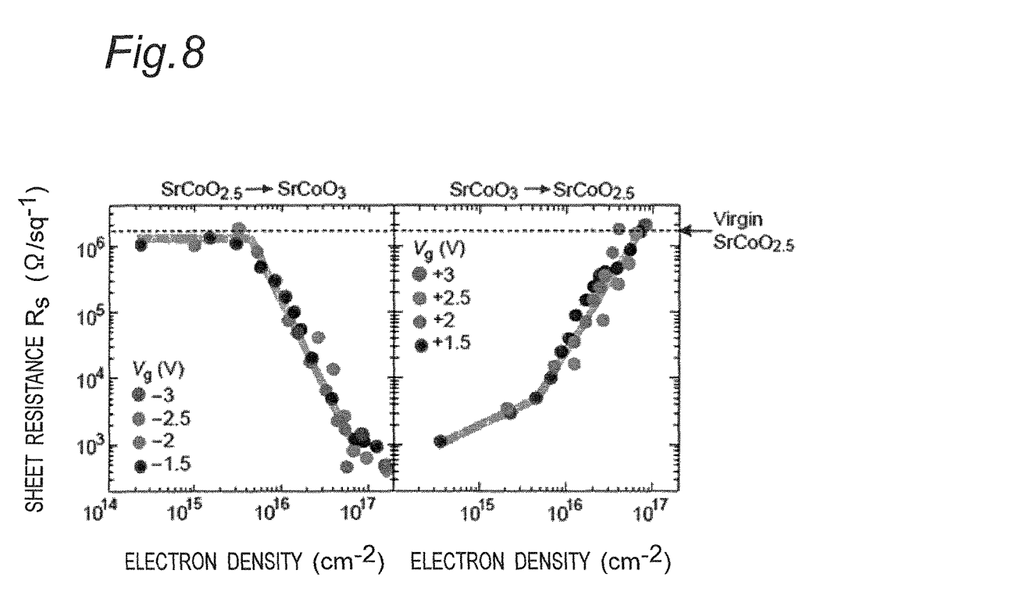
FIG. 8 is a graph showing the relationship between an electron density of the active layer and the sheet resistance of the magnetic transistor according to the embodiment of the present invention.

FIG. 8 shows the relationship between the electron density and the sheet resistance of the active layer 2 when different gate voltages Vg are applied to the magnetic transistor 100. The left graph of FIG. 8 is a graph when each of the four different gate voltages Vg (−3 V, −2.5 V, −2 V, and −1.5 V) is applied to the gate electrode of the magnetic transistor 100 in off-state so as to oxidize $SrCoO_{2.5}$ of the active layer 2 into $SrCoO_3$; and the right graph of FIG. 8 is a graph when each of the four different gate voltages Vg (+3 V, +2.5 V, +2 V, and +1.5 V) is applied to the gate electrode of the magnetic transistor 100 on-state so as to reduce $SrCoO_3$ of the active layer 2 into $SrCoO_{2.5}$.

For example, in the case of the left graph of FIG. 8, when the gate voltage Vg is applied, the water contained in the holes in the gate insulating film 3 is electrolyzed into protons ($H^+$) and hydroxide ions ($OH^-$). $SrCoO_{2.5}$ of the active layer 2 is oxidized by these hydroxide ions and becomes $SrCoO_3$, and the sheet resistance of the active layer 2 is thus lowered. As shown in the left graph of FIG. 8, the relationship between the electron density and the sheet resistance when each of the different gate voltages Vg is applied changes almost along the same straight line, and the electron density required for metallization is $7 \times 10^{16}$ cm$^{-2}$. The ideal electron density required for the oxidation reaction from $SrCoO_{2.5}$ to $SrCoO_3$ is $7 \times 10^{16}$ cm$^{-2}$, and the ideal electron density coincides with the quantity of electricity generated by the electrolysis (the amount of the hydroxide ions having moved to the active layer); therefore, it is understood that the Faraday's laws of electrolysis hold in the oxidation reaction of this magnetic transistor 100.

Similarly, in the case of the right graph of FIG. 8, the electron density and the sheet resistance when each of the different gate voltages Vg is applied change almost along the same straight line, and the electron density required to convert the active layer into an insulator is $7 \times 10^{16}$ cm$^{-2}$. The ideal electron density required for the reduction reaction from $SrCoO_3$ to $SrCoO_{2.5}$ is $7 \times 10^{16}$ cm$^{-2}$ and coincides with the quantity of electricity generated by the electrolysis (the amount of the protons having moved to the active layer); therefore, it is understood that the Faraday's laws of electrolysis hold also in this case.

As described above, it is confirmed that, in the magnetic transistor 100, the oxidation-reduction reaction occurring in the active layer 2 obeys the Faraday's laws of electrolysis.

Comparative Example

In the sample used for a comparative example, similarly to the experimental example, a (100) $SrTiO_3$ single crystal substrate (made by SHINKOSHA CO., LTD., size 10×10× 0.5 mm) was prepared, and an $SrCoO_{2.5}$ epitaxial thin film (film thickness was 40 nm) was formed on the substrate by a pulsed laser deposition method. Next, the substrate was heated in flowing oxygen gas.

The $SrCoO_{2.5}$ epitaxial thin film of such a sample was subjected to an X-ray diffraction measurement and a magnetic characteristics measurement. The X-ray diffraction measurement and the magnetic characteristics measurement were performed in the same way as in the experimental example.

As a result of the measurement, it was found that when the heating in flowing oxygen gas is performed at a heating temperature of 300° C. or higher, $SrCoO_{2.5}$ of the epitaxial thin film became $SrCoO_3$, and it is possible to control the oxygen nonstoichiometry x in $SrCoO_x$ by the environmental oxygen pressure. On the other hand, when the heating temperature is lower than 300° C., in particular, a temperature close to a room temperature, $SrCoO_{2.5}$ of the epitaxial thin film did not become $SrCoO_3$, and whereby the oxygen nonstoichiometry cannot be controlled.

That is, it was found that the oxygen nonstoichiometry of $SrCoO_x$ could be controlled only at a high temperature equal to or higher than 300° C. and that, in the vicinity of a room temperature, the crystal structure of the epitaxial thin film cannot not be changed only by controlling the environmental oxygen pressure. That is, with respect to the sample of the comparative example, the active layer cannot be switched, in the vicinity of a room temperature, between a ferromagnetic metal and an antiferromagnetic insulator, the transistor operation is impossible at a room temperature.

DESCRIPTION OF REFERENCE SYMBOLS

1 SUBSTRATE
2 ACTIVE LAYER
3 GATE INSULATING FILM
11 SOURCE ELECTRODE
12 DRAIN ELECTRODE
13 GATE ELECTRODE
20 HYDROXIDE ION (OH$^-$)
21 PROTON (H$^+$)
100 MAGNETIC TRANSISTOR

The invention claimed is:

1. A semiconductor device comprising:
an active layer comprising an oxide magnetic material; and
porous dielectrics which contains water and is provided on the active layer,
wherein hydrogen ions and hydroxide ions generated by electrolysis of the water are used to change a crystal structure of the active layer between a ferromagnetic metal and an antiferromagnetic insulator.

2. A semiconductor device comprising:
a substrate;
an active layer which is provided on the substrate and comprises an oxide magnetic material;
a source electrode and a drain electrode disposed on the substrate so as to sandwich the active layer;
porous dielectrics which contains water and is provided on the active layer; and
a gate electrode provided on the porous dielectrics,
wherein a voltage is applied to the gate electrode to electrolyze the water, and
hydrogen ions and hydroxide ions generated by the electrolyzing is used to change a crystal structure of the active layer between a ferromagnetic metal and an antiferromagnetic insulator.

3. The semiconductor device according to claim 1, wherein an oxygen content of the active layer changes between a ferromagnetic metal and an antiferromagnetic insulator.

4. The semiconductor device according to claim 1, wherein the ferromagnetic metal comprises $SrCoO_3$ with a perovskite structure, and the antiferromagnetic insulator comprises $SrCoO_{2.5}$ with a brownmillerite structure.

5. The semiconductor device according to claim 1, wherein the active layer comprises an oxide represented by $ABO_x$, where A is Ca, Sr, or Ba; B is Co, Mn, Cr, Fe, or Ni; and $2.0 \leq x \leq 3.5$.

6. The semiconductor device according to claim 1, wherein the porous dielectrics includes at least one selected from a group consisting of $12CaO.7Al_2O_3$, CaO, $Al_2O_3$, $12SrO.7Al_2O_3$, $Y_2O_3$, $HfO_2$, $SiO_2$, MgO, $NaTaO_3$, $KTaO_3$, $LaAlO_3$, $ZrO_2$, $MgAl_2O_4$, $Nb_2O_5$, $Ta_2O_5$, $Si_3N_4$, $SrTiO_3$, $BaTiO_3$, $CaTiO_3$, $SrZrO_3$, $CaZrO_3$, $BaZrO_3$, and zeolite.

7. The semiconductor device according to claim 1, wherein the porous dielectrics comprises porous dielectrics in which a hole rate is 5 to 70 vol % and in which a moisture content is 23 to 100 vol %.

8. The semiconductor device according to claim 2, wherein an oxygen content of the active layer changes between a ferromagnetic metal and an antiferromagnetic insulator.

9. The semiconductor device according to claim 2, wherein the ferromagnetic metal comprises $SrCoO_3$ with a perovskite structure, and the antiferromagnetic insulator comprises $SrCoO_{2.5}$ with a brownmillerite structure.

10. The semiconductor device according to claim 2, wherein the active layer comprises an oxide represented by $ABO_x$, where A is Ca, Sr, or Ba; B is Co, Mn, Cr, Fe, or Ni; and $2.0 \leq x \leq 3.5$.

11. The semiconductor device according to claim 2, wherein the porous dielectrics includes at least one selected from a group consisting of $12CaO \cdot 7Al_2O_3$, $CaO$, $Al_2O_3$, $12SrO \cdot 7Al_2O_3$, $Y_2O_3$, $HfO_2$, $SiO_2$, $MgO$, $NaTaO_3$, $KTaO_3$, $LaAlO_3$, $ZrO_2$, $MgAl_2O_4$, $Nb_2O_5$, $Ta_2O_5$, $Si_3N_4$, $SrTiO_3$, $BaTiO_3$, $CaTiO_3$, $SrZrO_3$, $CaZrO_3$, $BaZrO_3$, and zeolite.

12. The semiconductor device according to claim 2, wherein the porous dielectrics comprises porous dielectrics in which a hole rate is 5 to 70 vol % and in which a moisture content is 23 to 100 vol %.

\* \* \* \* \*